United States Patent
Yang et al.

(10) Patent No.: US 11,658,096 B2
(45) Date of Patent: May 23, 2023

(54) FLOATING HEAT SINK AND ELASTIC SUPPORT THEREOF

(71) Applicant: Huawei Technologies Co., Ltd., Shenzhen (CN)

(72) Inventors: Jingfeng Yang, Dongguan (CN); Yehua Zhang, Dongguan (CN); Yanghao Sun, Shenzhen (CN); Jiping Peng, Dongguan (CN); Baojian Du, Dongguan (CN); Yi Zheng, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 496 days.

(21) Appl. No.: 16/750,887

(22) Filed: Jan. 23, 2020

(65) Prior Publication Data

US 2020/0161211 A1 May 21, 2020

Related U.S. Application Data

(63) Continuation of application No. PCT/CN2018/094707, filed on Jul. 5, 2018.

(30) Foreign Application Priority Data

Jul. 29, 2017 (CN) .......................... 201720938742.8

(51) Int. Cl.
*H01L 23/40* (2006.01)
*H05K 7/20* (2006.01)

(52) U.S. Cl.
CPC .. *H01L 23/4006* (2013.01); *H01L 2023/4062* (2013.01); *H01L 2023/4081* (2013.01); *H01L 2023/4087* (2013.01); *H05K 7/20* (2013.01)

(58) Field of Classification Search
CPC ..... H01L 2023/4006; H01L 2023/4081; H01L 2023/4087; H01L 20/4006; H05K 7/20
See application file for complete search history.

(56) References Cited

U.S. PATENT DOCUMENTS

| 6,037,660 | A | 3/2000 | Liu | |
|---|---|---|---|---|
| 6,680,848 | B2 * | 1/2004 | Petit | .................... H01L 23/4006 361/704 |
| 9,423,119 | B2 * | 8/2016 | Schroll | ................... F21V 29/70 |

(Continued)

FOREIGN PATENT DOCUMENTS

| CN | 2463959 Y | 12/2001 |
|---|---|---|
| CN | 2924791 Y | 7/2007 |

(Continued)

*Primary Examiner* — Leonard R Leo
(74) *Attorney, Agent, or Firm* — Conley Rose, P.C.

(57) ABSTRACT

A floating heat sink includes an elastic support and a heat dissipating piece. The elastic support is integrally formed and includes at least two fasteners and at least two elastic arms. The fasteners are configured to mount the heat dissipating piece. All the fasteners and all the elastic arms are arranged around the heat dissipating piece. Two ends of the elastic arm are both connected to the fastener, and the two ends of the elastic arm are arranged in a circumferential direction of the heat dissipating piece. A middle part of the elastic arm is configured to be connected to a board in a fastened manner, and the middle part of the elastic arm is bent toward the board.

19 Claims, 4 Drawing Sheets

(56) References Cited

U.S. PATENT DOCUMENTS

| | | |
|---|---|---|
| 2008/0224019 A1 | 9/2008 | Luo |
| 2008/0291638 A1 | 11/2008 | Ma et al. |
| 2014/0285972 A1 | 9/2014 | Hong et al. |
| 2020/0161211 A1 | 5/2020 | Yang et al. |

FOREIGN PATENT DOCUMENTS

| | | |
|---|---|---|
| CN | 203827678 U | 9/2014 |
| CN | 104094051 A | 10/2014 |
| CN | 207531242 U | 6/2018 |
| WO | 03031897 A1 | 4/2003 |
| WO | 2013112838 A1 | 8/2013 |

* cited by examiner

FLOATING HEAT SINK AND ELASTIC SUPPORT THEREOF

CROSS-REFERENCE TO RELATED APPLICATIONS

This is a continuation of Int'l Patent App. No. PCT/CN2018/094707 filed on Jul. 5, 2018, which claims priority to Chinese Patent App. No. 201720938742.8 filed on Jul. 29, 2017, which are incorporated by reference.

TECHNICAL FIELD

The present disclosure relates to a heat dissipating apparatus in an electronic device, and in particular, to a floating heat sink and an elastic support thereof.

BACKGROUND

As functions of terminal devices are enhanced, components have a growing demand for heat dissipation. Therefore, a low-cost, small-sized, and reliable heat dissipation solution is needed. Existing heat sinks are classified into fixed heat sinks and floating heat sinks.

A fixed heat sink is currently a mainstream heat dissipation solution for small-sized devices, and includes three parts: a heat dissipating component, a thermal pad, and fasteners. A working principle of the fixed heat sink is as follows: Heat generated during working of a chip is transferred through the thermal pad to the heat dissipating component, and then the heat is conducted through the heat dissipating component to air for heat dissipation. The heat dissipating component is fastened onto a board by using screws and the like. However, a tolerance exists both in manufacturing of structural parts and in overall assembly, and therefore a heat conducting medium needs to have a specific tolerance capability, to ensure normal working of the heat sink. During practical use, calculation based on tolerance analysis needs to be performed to determine a size of a gap between a heat emitting component and the heat dissipating component, to ensure that the thermal pad works in a proper compression range. Although a structure is simple and implementation is easy in this solution, the solution has the following problem: Due to a demand for tolerance, a thickness of the thermal pad is relatively large, causing a relatively high thermal conduction resistance. This affects an overall heat dissipation capability to some extent.

A floating heat sink is a heat dissipation solution that is relatively widely applied in current chassis devices, and includes four parts: a heat dissipating component, a heat conducting medium, fasteners, and springs. A working principle of the floating heat sink is as follows: The heat dissipating component is fixed on a board by using screws and the springs, to ensure that the heat dissipating component keeps in contact with a heat emitting component under the action of the springs. In addition, considering that surfaces of the heat dissipating component and the heat emitting component are uneven, thermally conductive silicon is added to ensure a full contact. A tolerance in manufacturing of structural parts and a tolerance in overall assembly are absorbed through an elastic force of the springs of the heat sink. During practical use, a proper pre-pressure of the springs needs to be calculated based on pressure to be borne by a chip. Although a tolerance capability is strong in this solution, the solution is very difficult to implement in narrow space due to complex structural composition and a relatively large size.

It some approaches, the fixed heat sink can have a relatively small size but an insufficient tolerance capability, and can be used only in cooperation with a thermal pad; and the floating heat sink has a relatively strong tolerance capability, and can be used in cooperation with a medium such as thermal grease, but has a complex structure and a relatively large size, and therefore is difficult to apply to a device that has narrow space. Therefore, a heat sink with a relatively small size and a tolerance capability is needed.

SUMMARY

A technical problem to be resolved by embodiments of the present disclosure lies in providing a floating heat sink and an elastic support thereof. The floating heat sink has a small size and a relatively strong tolerance capability.

According to a first aspect, an embodiment of the present disclosure provides an elastic support, used for a floating heat sink, where the elastic support is integrally formed and includes at least two fasteners and at least two elastic arms, the fasteners are configured to mount a heat dissipating piece, all the fasteners and all the elastic arms are arranged around the heat dissipating piece, two ends of the elastic arm are both connected to the fastener, the two ends of the elastic arm are arranged in a circumferential direction of the heat dissipating piece, a middle part of the elastic arm is configured to be connected to a board in a fastened manner, and the middle part of the elastic arm is bent toward the board.

In a first possible implementation of the first aspect, the fastener is a strip-shaped fastener that is disposed along an edge of the heat dissipating piece.

With reference to the first possible implementation of the first aspect, in a second possible implementation, all the fasteners are sequentially connected to form a ring.

With reference to any one of the foregoing implementations of the first aspect, in a third possible implementation of the first aspect, a side, close to the heat dissipating piece, of the fastener is bent in a direction away from the board, to appear to be step-shaped.

With reference to any one of the foregoing implementations of the first aspect, in a fourth possible implementation of the first aspect, a tooling positioning hole is disposed on the fastener.

With reference to any one of the foregoing implementations of the first aspect, in a fifth possible implementation, two ends of one of the elastic arms are respectively connected to two ends of one of the fasteners; or two ends of one of the elastic arms are respectively connected to two of the fasteners.

With reference to any one of the foregoing implementations of the first aspect, in a sixth possible implementation, the elastic arm includes two elastic sub-arms and one mounting part, the mounting part is connected in the middle of the two elastic sub-arms in a fastened manner, to form the middle part of the elastic arm, the elastic sub-arm includes a flat portion and a bending portion that are connected in a fastened manner, the flat portion is disposed in parallel to the board and is connected to the fastener in a fastened manner, and the bending portion is bent toward the board and is connected to the mounting part in a fastened manner.

With reference to any one of the foregoing implementations of the first aspect, in a seventh possible implementation, the fastener and the elastic arm are both in sheet-like structures.

According to a second aspect, the present disclosure provides a floating heat sink, including the foregoing elastic support and a heat dissipating piece, where the heat dissipating piece is connected to fasteners of the elastic support.

In a first possible implementation of the second aspect, the floating heat sink further includes an insulating piece, the heat dissipating piece protrudes toward the board to form a boss, and the insulating piece is ring-shaped and disposed around the boss.

In a second possible implementation of the second aspect, a buffer piece is disposed on a side, facing the board, of the insulating piece, the buffer piece includes a connection ring and a plurality of buffer blocks, the connection ring is connected to the insulating piece in a fastened manner, the plurality of buffer blocks are connected to the connection ring in a fastened manner, and the plurality of buffer blocks are arranged around the boss.

According to the floating heat sink and the elastic support thereof in the present disclosure, the fasteners are connected to the heat dissipating piece, and therefore can apply an acting force to the heat dissipating piece, so that the heat dissipating piece is better connected to a heat emitting component, to help absorb heat of the heat emitting component for heat dissipation. The two ends of the elastic arm are connected to the fastener, and therefore two acting points can be generated for the heat dissipating piece by using one elastic arm, so that the heat dissipating piece is evenly stressed. The middle part of the elastic arm is bent toward the board and is suspended in air, and therefore the elastic arm has a specific elastic deformation capability in a thickness direction of the board. The middle part of the elastic arm is connected to the board, and therefore an elastic force can be generated through deformation of the elastic arm, so that a distance between the heat dissipating piece and the heat emitting component can be adaptively adjusted. In this way, the floating heat sink has a relatively strong tolerance capability, and no elastic component needs to be further configured, thereby featuring a simplified structure and a relatively small overall size, to facilitate manufacturing, molding, and installation.

BRIEF DESCRIPTION OF DRAWINGS

To more clearly describe the technical solutions, the following describes the accompanying drawings.

DESCRIPTION OF EMBODIMENTS

The following describes the embodiments of the present disclosure with reference to the accompanying drawings of the embodiments of the present disclosure.

Figure 1:
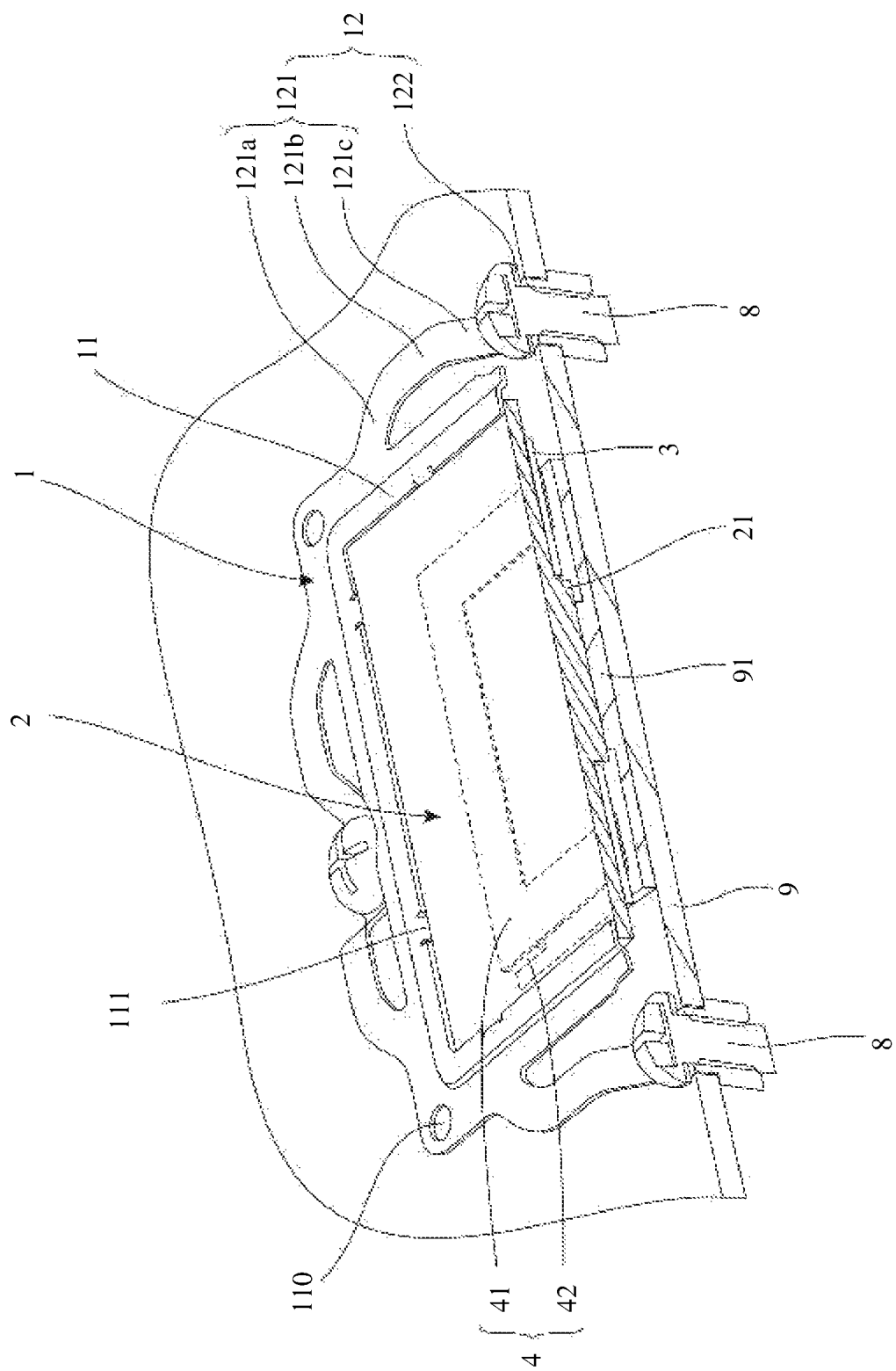
FIG. 1 is a cutaway drawing that is obtained after a floating heat sink is connected to a board according to a first embodiment of the present disclosure.
Figure 2:
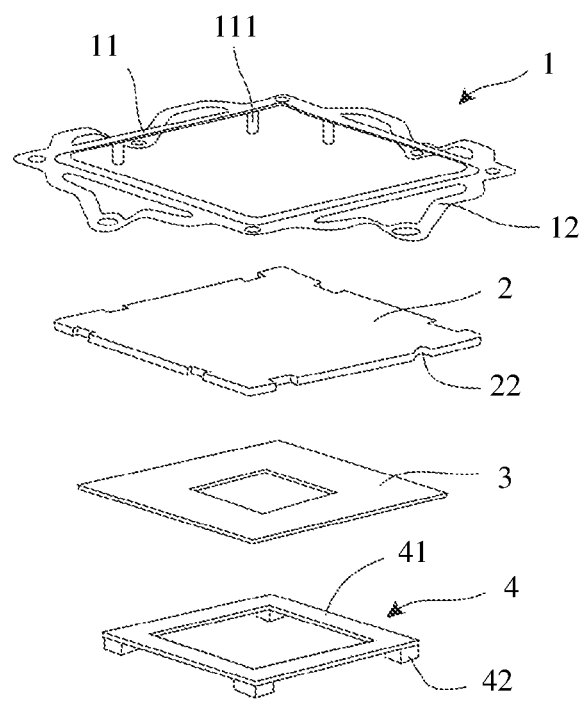
FIG. 2 is a schematic exploded diagram of the floating heat sink in FIG. 1.

FIG. 1 and FIG. 2 show a floating heat sink according to an embodiment of the present disclosure. The floating heat sink includes an elastic support 1 and a heat dissipating piece 2. The heat dissipating piece 2 is mounted at a heat emitting component 91 of a board 9 by using the elastic support 1. The heat dissipating piece 2 is connected to the heat emitting component 91, to dissipate heat of the heat emitting component 91. Relative floating of a distance between the heat dissipating piece 2 and the board 9 can be implemented through elasticity of the elastic support 1.

The floating heat sink may further include an insulating piece 3. The heat dissipating piece 2 protrudes toward the board 9 to form a boss 21. The insulating piece 3 is ring-shaped and disposed around the boss 21. The heat dissipating piece 2 can absorb heat of the heat emitting component 91 by using the boss 21, for heat dissipation. The insulating piece 3 can be used to prevent the heat dissipating piece 2 from being in contact with welding points around the heat emitting component 91, to avoid a fault such as a short circuit. A medium such as thermal grease (or thermally conductive silicon) can be coated with between the boss 21 of the heat dissipating piece 2 and the heat emitting component 91, to ensure a full contact between the heat dissipating component and the heat emitting component 91 when surfaces are uneven, thereby improving a heat dissipation effect.

Further, a buffer piece 4 is disposed on a side, facing the board 9, of the insulating piece 3. The buffer piece 4 is located between the heat dissipating piece 2 and the heat emitting component 91. The buffer piece 4 includes a connection ring 41 and a plurality of buffer blocks 42. The connection ring 41 is connected to the insulating piece 3 in a fastened manner. The plurality of buffer blocks 42 are connected to the connection ring 41 in a fastened manner, and the plurality of buffer blocks 42 are arranged around the boss 21. The plurality of buffer blocks 42 can press against an upper surface of the heat emitting component 91, to avoid damage to a part of the heat emitting component 91 that is caused by tilting of the heat dissipating component, thereby improving overall reliability.

The elastic support 1 is used for the floating heat sink. The elastic support 1 is integrally formed on the whole to facilitate manufacturing and preparation. The elastic support 1 includes at least two fasteners 11 and at least two elastic arms 12. The fasteners 11 are configured to mount the heat dissipating piece 2. All the fasteners 11 and all the elastic arms 12 are arranged around the heat dissipating piece 2. Two ends of the elastic arm 12 are both connected to the fastener 11, and the two ends of the elastic arm 12 are arranged in a circumferential direction of the heat dissipating piece 2. A middle part of the elastic arm 12 is configured to be connected to the board 9 in a fastened manner, and the middle part of the elastic arm 12 is bent toward the board 9.

The fasteners 11 are connected to the heat dissipating piece 2, and therefore can apply an acting force to the heat dissipating piece 2, so that the heat dissipating piece 2 is better connected to the heat emitting component 91, to help absorb heat of the heat emitting component 91 for heat dissipation. The two ends of the elastic arm 12 are connected to the fastener 11, and therefore two acting points can be generated for the heat dissipating piece 2 by using one elastic arm 12, so that the heat dissipating piece 2 is evenly stressed. The middle part of the elastic arm 12 is bent toward the board 9 and is suspended in air, and therefore the elastic arm 12 has a specific elastic deformation capability. The middle part of the elastic arm 12 is connected to the board 9 by using screws 8, and a specific gap is kept between the middle part of the elastic arm 12 and the board 9, and therefore an elastic force can be generated through deformation of the elastic arm 12, so that a distance between the heat dissipating piece 2 and the heat emitting component 91 can be adaptively adjusted. In this way, the floating heat sink has a relatively strong tolerance capability, and no elastic component needs to be further configured, thereby featuring a simplified structure and a relatively small overall size, to facilitate manufacturing, molding, and installation.

Figure 3:
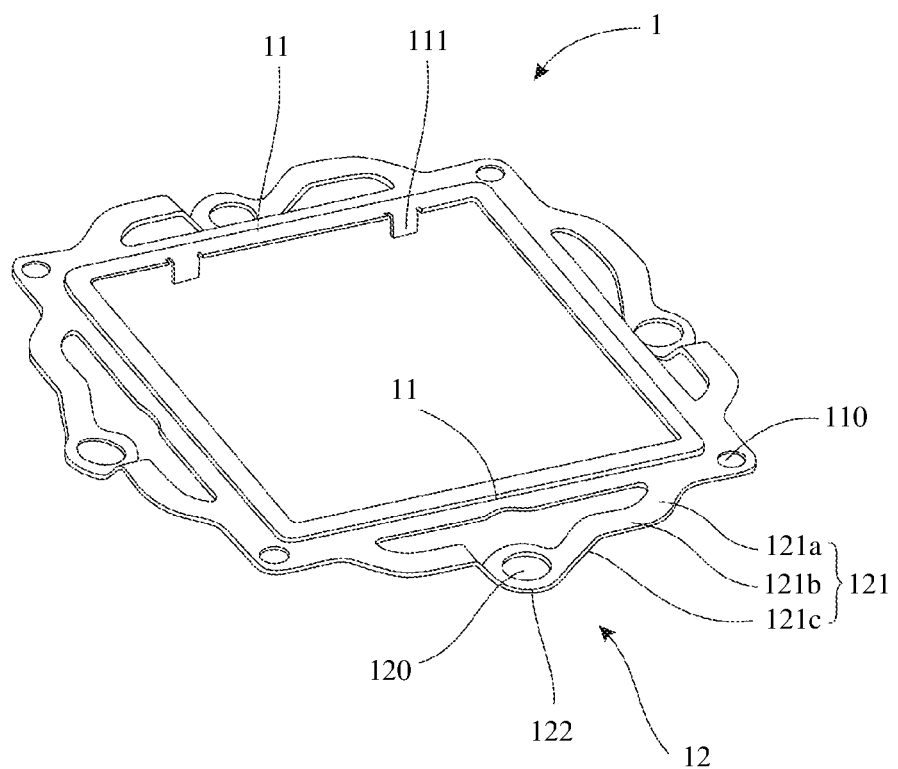
FIG. 3 is a schematic diagram of an elastic support of the floating heat sink in FIG. 2.

Referring to FIG. 3, in this embodiment, the fastener 11 is a strip-shaped fastener that is disposed along an edge of the heat dissipating piece 2, to facilitate connection between the fastener 11 and the heat dissipating piece 2. The heat dissipating piece 2 is square, and there are four fasteners 11. The four strip-shaped fasteners 11 are disposed along four edges of the heat dissipating piece 2. Further, all the four fasteners 11 are sequentially connected to form a ring, and therefore appear to be a frame, to encircle the heat dissipating piece 2. The heat dissipating piece 2 can be fastened within the four strip-shaped fasteners 11. The elastic support 1 is firmly connected to the heat dissipating piece 2, and can evenly apply pressure to the heat dissipating piece 2 around the heat dissipating piece 2.

A side, close to the heat dissipating piece 2, of the fastener 11 is bent in a direction away from the board 9, to appear to be step-shaped. Positioning of the heat dissipating piece 2 can be implemented through cooperation between step-shaped structures on the plurality of fasteners 11 and the edges of the heat dissipating piece 2, to prevent the heat dissipating piece 2 from moving in a direction parallel to the board 9.

A positioning lug 111 may be disposed on the fastener 11, and correspondingly a positioning slot 22 may be disposed on the heat dissipating piece 2. The positioning lug 111 is plug-connected to the positioning slot 22. Through cooperation between the positioning lug 111 and the positioning slot 22, positioning between the fastener 11 and the heat dissipating piece 2 can be implemented, and the fastener 11 and the heat dissipating piece 2 can be assembled into a whole part, so that the fastener 11 and the heat dissipating piece 2 are mounted at the heat emitting component 91 of the board 9 as a whole.

A tooling positioning hole 110 is disposed on the fastener 11. The tooling positioning hole 110 can be used to help automation equipment clamp and position the elastic support 1, to facilitate automatic assembly.

There are four elastic arms 12. The four elastic arms 12 are one-to-one correspondingly connected to the four fasteners 11. The four elastic arms 12 are respectively located at the four edges of the heat dissipating piece 2, so that the heat dissipating piece 2 is evenly stressed in all directions. Two ends of one of the elastic arms 12 are respectively connected to two ends of one of the fasteners 11, so that the two ends of the elastic arm 12 are respectively located at two adjacent corners of the heat dissipating piece 2.

The elastic arm 12 and the fastener 11 are both in sheet-like structures. The entire elastic support 1 may be formed by stamping a metal sheet or a metal plate, to facilitate manufacturing and molding, and to enable the entire elastic support 1 to have a relatively small thickness, thereby reducing a size of the entire floating heat sink, reducing space occupied by the floating heat sink, and facilitating miniaturization of a size of an electronic device.

The elastic arm 12 includes two elastic sub-arms 121 and one mounting part 122. The mounting part 122 is connected in the middle of the two elastic sub-arms 121 in a fastened manner, to form the middle part of the elastic arm 12. The elastic sub-arm 121 includes a flat bending portion 121a, a flat straight portion 121b, and a downward bending portion 121c that are sequentially connected. The flat bending portion 121a is connected to the fastener 11 in a fastened manner. Both the flat bending portion 121a and the flat straight portion 121b are disposed in parallel to the board 9. The downward bending portion 121c is bent toward the board 9 and is connected to the mounting part 122 in a fastened manner. A gap is disposed between the flat straight portion 121b and the fastener 11 as well as between the downward bending portion 121c and the fastener 11. A mounting hole 120 may be disposed on the mounting part 122, so that the mounting part 122 is connected to the board 9 by using the screw 8.

The flat bending portion 121a can be used to enable the entire elastic arm 12 to be connected to the fastener 11. In addition, the flat bending portion 121a can be extended in a direction away from the fastener 11, so that the flat straight portion 121b, the downward bending portion 121c, and the mounting part 122 each can maintain a specific gap with the fastener 11 and be suspended in air, to facilitate elastic deformation of the elastic arm 12. Both the flat bending portion 121a and the flat straight portion 121b are disposed in parallel to the board 9, to avoid an increase in the thickness of the elastic support 1. The flat straight portion 121b can be used to increase a length of the elastic arm 12 in a direction parallel to the board 9, without increasing the thickness of the elastic support 1. The flat straight portion 121b may be extended along an edge of the heat dissipating piece 2. The bending portion can be used to enable the mounting part 122 to be relatively close to the board 9, to facilitate connection between the mounting part 122 and the board 9. A gap is disposed between the mounting part 122 and the board 9. In other words, a gap is reserved between a mounting surface of the elastic arm 12 and the board 9 during installation. After the heat sink is installed, the elastic arm 12 generates recoverable elastic deformation under the action of the screws 8. A sheet-like metal material has relatively high elasticity, only end portions of the elastic arm 12 are connected to the fastener 11, and the other parts of the elastic arm 12 and the fastener 11 are disposed with a gap. Therefore, a perimeter of the elastic arm 12 has been hollowed, and the entire elastic arm 12 is in a cantilever state. The elastic arm 12 can be deformed in a thickness direction of the board, and can maintain pre-pressure on the heat emitting component 91 within a relatively large range without causing a heat dissipation failure. In this way, a requirement for heat dissipation in very small space can be met without adding an auxiliary component such as a spring.

The floating heat sink and the elastic support 1 thereof provided in the present disclosure can be applied to various electronic devices that need heat dissipation. For example, an application scenario is a heat dissipation system for a base of a video conference camera. In this application scenario, the floating heat sink is mounted onto a chip of the board 9 by using fastening screws and two-sided female nuts, to implement heat dissipation; and the board 9 and the floating heat sink are fastened onto the base of the camera as a whole, and heat conducted by the heat sink is conducted through a middle air layer to the die-cast base of the camera for temperature equalization.

Before assembly, a gap is reserved between the floating heat sink in the present disclosure and the board 9. After screws are connected to the board 9 in a fastened manner through mounting parts 122, the elastic arms 12 of the elastic support 1 deform, so that the heat sink and the heat emitting component 91 may be closely in contact with each other under the pull of the four elastic arms 12. This is equivalent to providing pre-pressure for the heat sink, to perform full heat conduction. The integrated design solution of the elastic support 1 and the heat dissipating component provides reliable heat dissipation support for limited space in the base of the camera. During designing of the floating heat sink, an amount of pre-deformation of the elastic arm 12 may be designed based on a pressure-bearing capability of a main chip, namely, the heat emitting component 91, to ensure that proper pre-pressure is applied on the entire heat sink after the screws are tightened.

An assembly tolerance and a manufacturing tolerance of the heat sink in the present disclosure may be absorbed through deformation of the elastic arm 12. Therefore, it is suitable to select thermal grease to improve overall heat dissipation efficiency. Disposition of a heat conducting medium greatly affects improvement of the overall heat dissipation efficiency. In terms of a heat conduction effect, a thinner heat conducting medium indicates a smaller thermal resistance and higher heat conduction efficiency. By using thermal grease, the heat conducting medium can be made very thin and achieve high heat conduction efficiency, but basically has no tolerance absorption capability. By using the elastic support 1 provided in the present disclosure, the disadvantage that the thermal grease has a poor tolerance absorption capability can be overcome through a tolerance absorption capability of the elastic support 1. In addition, use of the insulating piece ensures that no short circuit is caused to other parts of the board 9 when the heat sink deviates during overall installation, thereby improving system reliability.

Because the elastic support 1 is disposed in the present disclosure, the tolerance capability of the heat sink can be ensured through the structure itself, and the heat conduction efficiency does not decrease due to use of the heat conducting medium. In addition, in the present disclosure, the deformation of the elastic support 1 that is made of a common elastic material is used to replace an auxiliary component such as a spring, and the elastic support 1 can be directly fastened onto the board 9 by using screws, so that the size of the heat sink is reduced, and manufacturing and assembly costs are reduced. The overall structure is in a simple form and a small size.

According to the floating heat sink and the elastic support 1 provided in the present disclosure, a size is small and there is no auxiliary part such as a spring, so that heat dissipation for the heat emitting component 91 can be implemented in very small space; costs are low, because the elastic support 1 may be made of a common elastic material with no special technology and with low single-part costs; installation is easy, because the floating heat sink can be directly fastened onto the board 9 by using screws or clamps; and reliability is high and a tolerance capability is strong, so that no damage is caused to a sensitive component within a relatively wide precision range.

In the foregoing implementation, the elastic support 1 may be connected to the board 9 in a fastened manner by putting the screws through the mounting holes 120 of the mounting parts 122. In addition, in another implementation, the mounting parts 122 may be connected to the board 9 in a fastened manner by disposing clamps on the mounting parts 122 or by using other fasteners.

Figure 4:
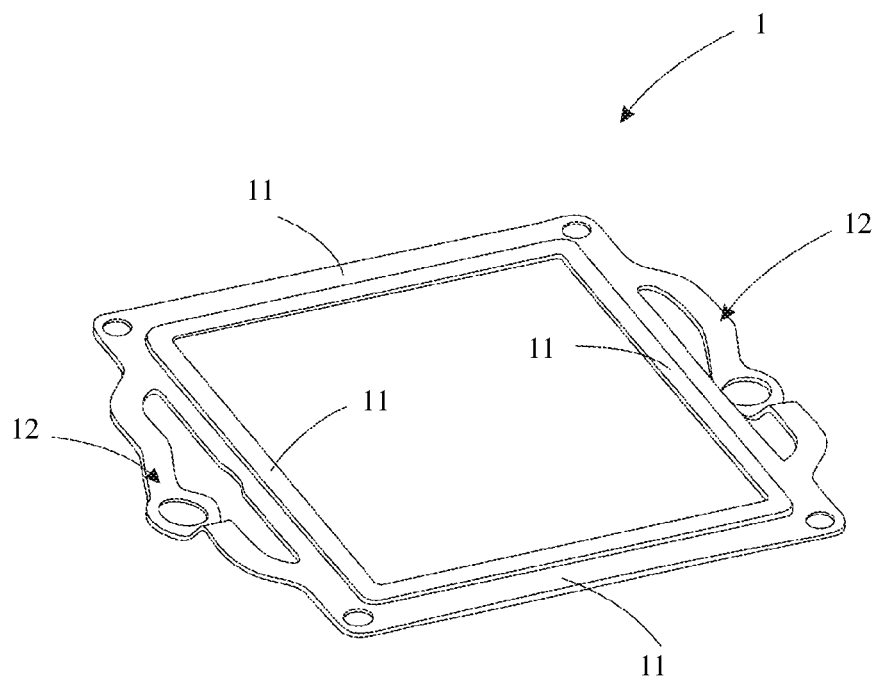
FIG. 4 is a schematic diagram of an elastic support according to a second embodiment of the present disclosure.

In the foregoing implementation, a quantity of elastic arms 12 is the same as a quantity of fasteners 11, and both the two quantities are 4. In another implementation, a quantity of elastic arms and a quantity of fasteners are not limited to the foregoing quantity, and the two quantities may be different. Referring to FIG. 4, in an elastic support 1 provided in a second embodiment of the present disclosure, there are four fasteners 11 that are connected to form a ring, to form a frame that cooperates with a heat sink. There are two elastic arms 12. The two elastic arms 12 are respectively connected, in a fastened manner, to two fasteners 11 that are opposite to each other, so that the two elastic arms 12 are disposed symmetrically relative to the heat sink, to provide even acting forces for a heat dissipating piece 2. A specific structure of the elastic arm 12 is the same as that in the first embodiment, and details are not described herein again.

Figure 5:
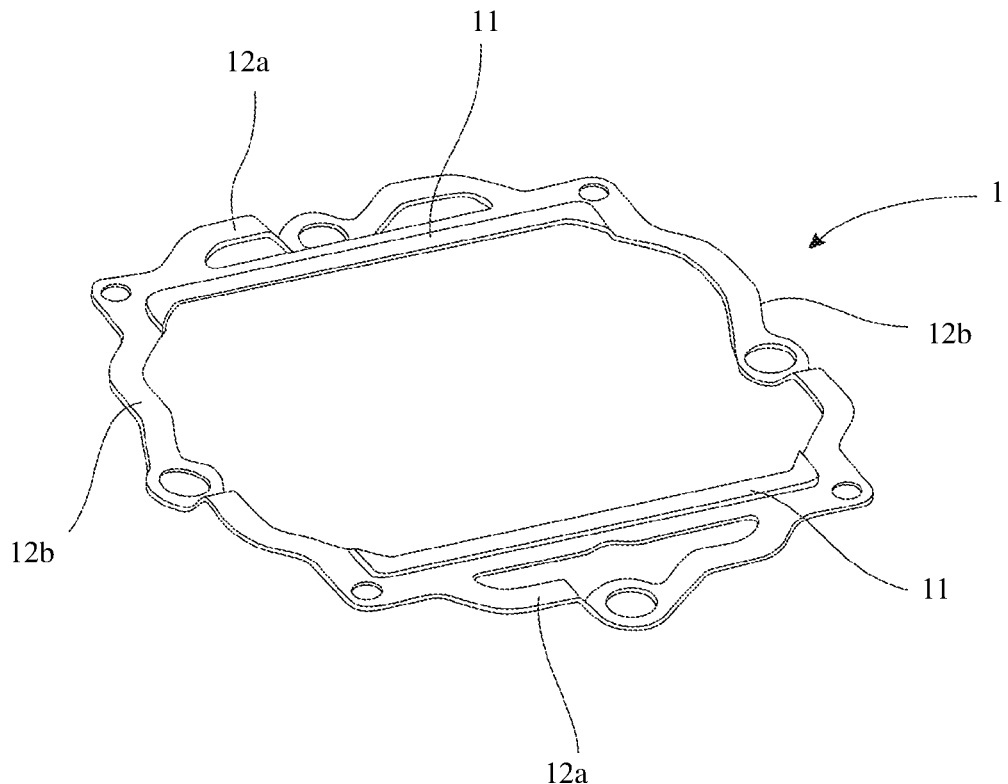
FIG. 5 is a schematic diagram of an elastic support according to a third embodiment of the present disclosure.

In the foregoing implementation, two ends of one elastic arm are respectively connected to two ends of a same fastener. In another implementation, two ends of one elastic arm may be respectively connected to two fasteners. Referring to FIG. 5, in an elastic support 1 provided in a third embodiment of the present disclosure, there are two fasteners 11 that are disposed opposite to each other, and there are four elastic arms 12a and 12b. Two ends of each of two elastic arms 12a are connected to two ends of a same fastener 11 in a fastened manner, and two ends of each of the other two elastic arms 12b are respectively connected to end portions of the two fasteners 11. The two fasteners 11 may cooperate with two opposite edges of a heat dissipating piece 2, to position the heat dissipating piece 2 and apply an acting force to the heat dissipating piece 2.

Figure 6:
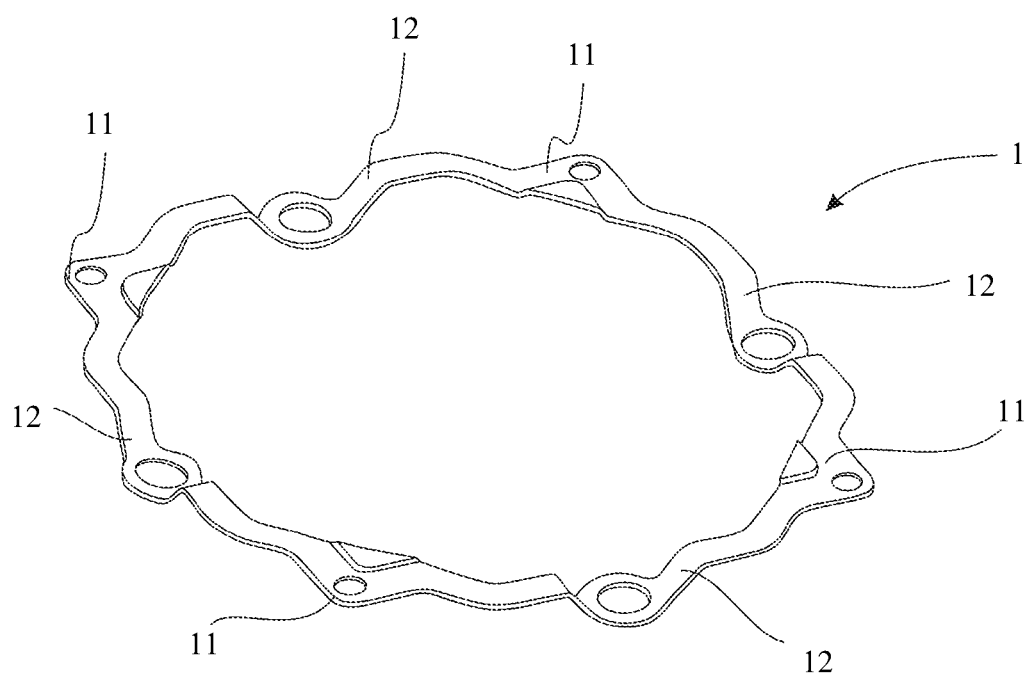
FIG. 6 is a schematic diagram of an elastic support according to a fourth embodiment of the present disclosure.

In the foregoing implementation, the fastener 11 is a strip-shaped fastener that is disposed along an edge of the heat dissipating piece 2. In another implementation, the fastener 11 may alternatively be in another shape. Referring to FIG. 6, in an elastic support 1 provided in a fourth implementation of the present disclosure, a fastener 11 is correspondingly connected only to a corner of a heat dissipating piece 2, and the fastener 11 may be triangular. There are four fasteners 11 that may correspondingly cooperate with four corners of the square heat dissipating piece 2. A shape of an elastic arm 12 is the same as that in the foregoing embodiment, and details are not described herein again. There are four elastic arms 12. The four elastic arms 12 and the four fasteners 11 are arranged alternately and connected to each other to form a ring, and therefore can be evenly arranged around the heat dissipating piece 2, to apply even acting forces around the heat dissipating piece 2.

What is claimed is:

1. An elastic support comprising:
   fasteners comprising a first fastener and a second fastener configured to:
      mount a heat dissipating piece; and
      arrange around the heat dissipating piece,
      wherein the first fastener comprises a first end of the first fastener and a second end of the first fastener; and
   elastic arms configured to arrange around the heat dissipating piece when the heat dissipating piece is mounted in the elastic support,
   wherein the elastic arms comprise a first elastic arm and a second elastic arm, wherein the first elastic arm comprises a first end of the first elastic arm, a middle part, and a second end of the first elastic arm, wherein the first end of the first elastic arm is directly connected to the first end of the first fastener and the second end of the first elastic arm is directly connected to the second end of the first fastener, wherein the first end of the first elastic arm and the second end of the first elastic arm are configured to arrange in a circumferential direction of the heat dissipating piece when the heat dissipating piece is mounted in the elastic support, wherein the middle part is configured to bend toward a board and connect to the board in a fastened manner,
   wherein the first elastic arm further comprises a first elastic sub-arm, a second elastic sub-arm, and a mounting part connected in a middle of the first elastic sub-arm and the second elastic sub-arm in a fastened manner to form the middle part, wherein the first elastic sub-arm comprises a flat portion and a bending portion connected in a fastened manner, wherein the flat portion is disposed in parallel with the board and is connected to the first fastener in a fastened manner, and wherein the bending portion is bent toward the board and is connected to the mounting part in a fastened manner, and wherein the elastic support is integrally formed and configured to be used in a floating heat sink.

2. The elastic support of claim 1, wherein the first fastener is a strip-shaped fastener that is configured to be disposed along an edge of the heat dissipating piece.

3. The elastic support of claim 2, wherein the fasteners are sequentially connected to form a ring.

4. The elastic support of claim 1, wherein the first fastener comprises a first fastener side configured to:
position close to the heat dissipating piece; and
bend away from the board in a step-shaped manner.

5. The elastic support of claim 1, further comprising a tooling positioning hole disposed on the first fastener.

6. The elastic support of claim 1, wherein the first fastener and the first elastic arm are in sheet-like structures.

7. A floating heat sink comprising:
a heat dissipating piece; and
an elastic support comprising:
fasteners comprising a first fastener and a second fastener configured to:
mount the heat dissipating piece; and
arrange around the heat dissipating piece,
wherein the first fastener comprises a first end of the first fastener and a second end of the first fastener; and
elastic arms arranged around the heat dissipating piece and comprising a first elastic arm and a second elastic arm,
wherein the first elastic arm comprises a first end of the first elastic arm, a middle part, and a second end of the first elastic arm, wherein the first end of the first elastic arm is directly connected to the first end of the first fastener and the second end of the first elastic arm is directly connected to the second end of the first fastener, wherein the first end of the first fastener and the second end of the first fastener are configured to arrange in a circumferential direction of the heat dissipating piece, wherein the middle part is configured to bend toward a board and connect to the board in a fastened manner,
wherein the first elastic arm further comprises a first elastic sub-arm, a second elastic sub-arm, and a mounting part connected in a middle of the first elastic sub-arm and the second elastic sub-arm in a fastened manner to form the middle part, wherein the first elastic sub-arm comprises a flat portion and a bending portion connected in a fastened manner, wherein the flat portion is disposed in parallel with the board and is connected to the first fastener in a fastened manner, and wherein the bending portion is bent toward the board and is connected to the mounting part in a fastened manner, and
wherein the elastic support is integrally formed.

8. The floating heat sink of claim 7, wherein the fasteners are sequentially connected to form a ring.

9. The floating heat sink of claim 7, wherein the first fastener comprises a first fastener side configured to position close to the heat dissipating piece and to bend away from the board in a step-shaped manner.

10. The floating heat sink of claim 7, wherein the elastic support further comprises a tooling positioning hole disposed on the first fastener.

11. The floating heat sink of claim 7, wherein the first fastener and the first elastic arm are in sheet-like structures.

12. The floating heat sink of claim 7, wherein the heat dissipating piece protrudes toward the board to form a boss, and wherein the floating heat sink further comprises an insulating piece that is ring-shaped and disposed around the boss.

13. The floating heat sink of claim 12, wherein the insulating piece comprises an insulating piece side facing the board, wherein the floating heat sink further comprises a buffer piece disposed on the insulating piece side, wherein the buffer piece comprises a connection ring and buffer blocks, wherein the connection ring is connected to the insulating piece in a fastened manner, and wherein the buffer blocks are connected to the connection ring in a fastened manner and are arranged around the boss.

14. A floating heat sink comprising:
a heat dissipating piece; and
an elastic support comprising:
fasteners comprising a first fastener and a second fastener configured to:
mount the heat dissipating piece; and
arrange around the heat dissipating piece,
wherein the first fastener comprises a first end of the first fastener and a second end of the first fastener; and
elastic arms arranged around the heat dissipating piece and comprising a first elastic arm and a second elastic arm,
wherein the first elastic arm comprises a first end of the first elastic arm, a middle part, and a second end of the first elastic arm, wherein the first end of the first elastic arm is directly connected to the first end of the first fastener and the second end of the first elastic arm is directly connected to the second end of the first fastener, wherein the first end of the first elastic arm and the second end of the first elastic arm are configured to arrange in a circumferential direction of the heat dissipating piece, wherein the middle part is configured to bend toward a board and connect to the board in a fastened manner,
wherein the first elastic arm further comprises a first elastic sub-arm, a second elastic sub-arm, and a mounting part connected in a middle of the first elastic sub-arm and the second elastic sub-arm in a fastened manner to form the middle part, wherein the first elastic sub-arm comprises a flat portion and a bending portion connected in a fastened manner, wherein the flat portion is disposed in parallel with the board and is connected to the first fastener in a fastened manner, and wherein the bending portion is bent toward the board and is connected to the mounting part in a fastened manner,
wherein the elastic support is integrally formed, and
wherein the first fastener is a strip-shaped fastener that is configured to be disposed along an edge of the heat dissipating piece.

15. The floating heat sink of claim 14, wherein the first fastener comprises a positioning lug.

16. The floating heat sink of claim 15, wherein the heat dissipation piece comprises a positioning slot.

17. The floating heat sink of claim 16, wherein the positioning lug is connected to the positioning slot.

18. The floating heat sink of claim 14, wherein the fasteners are sequentially connected to form a ring.

19. The floating heat sink of claim 14, wherein the elastic support further comprises a tooling positioning hole disposed on the first fastener.

\* \* \* \* \*